(12) United States Patent
Pandey

(10) Patent No.: US 11,322,414 B2
(45) Date of Patent: May 3, 2022

(54) CONCURRENT MANUFACTURE OF FIELD EFFECT TRANSISTORS AND BIPOLAR JUNCTION TRANSISTORS WITH GAIN TUNING

(71) Applicant: GLOBALFOUNDRIES U.S. Inc., Malta, NY (US)

(72) Inventor: Shesh Mani Pandey, Saratoga Springs, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 27 days.

(21) Appl. No.: 16/720,084

(22) Filed: Dec. 19, 2019

(65) Prior Publication Data

US 2021/0193526 A1 Jun. 24, 2021

(51) Int. Cl.
| | |
|---|---|
| H01L 21/8249 | (2006.01) |
| H01L 27/06 | (2006.01) |
| H01L 29/08 | (2006.01) |
| H01L 21/74 | (2006.01) |
| H01L 29/10 | (2006.01) |
| H01L 21/265 | (2006.01) |
| H01L 21/266 | (2006.01) |

(52) U.S. Cl.
CPC ........ *H01L 21/8249* (2013.01); *H01L 21/266* (2013.01); *H01L 21/26513* (2013.01); *H01L 21/74* (2013.01); *H01L 27/0623* (2013.01); *H01L 29/0804* (2013.01); *H01L 29/0847* (2013.01); *H01L 29/1083* (2013.01)

(58) Field of Classification Search
None
See application file for complete search history.

(56) References Cited

U.S. PATENT DOCUMENTS

| | | | |
|---|---|---|---|
| 4,507,847 | A | 4/1985 | Sullivan |
| 5,572,394 | A | 11/1996 | Ker et al. |
| 6,465,768 | B1 | 10/2002 | Ker et al. |
| 6,716,709 | B1 | 4/2004 | Springer et al. |
| 6,794,730 | B2 | 9/2004 | Kim et al. |
| 6,828,635 | B2 | 12/2004 | Panday et al. |
| 7,106,568 | B2 | 9/2006 | Chen |
| 7,701,038 | B2 | 4/2010 | Chen et al. |
| 7,745,882 | B2 | 6/2010 | Kim |
| 7,843,038 | B2 | 11/2010 | Seremeta |

(Continued)

*Primary Examiner* — Alexander G Ghyka
(74) *Attorney, Agent, or Firm* — Gibb & Riley, LLC; Francois Pagette

(57) ABSTRACT

Bipolar junction transistors include a collector, a base on the collector, and an emitter on the base. The base is between the collector and the emitter. The emitter comprises first portions and a second portion on the base. The first portions of the emitter are between the second portion of the emitter and the base. The first portions and the second portion comprise doped areas that are doped with the same polarity impurity in different concentrations. The base comprises a doped area that is doped with an opposite polarity impurity from the first and second portions of the emitter. The first portions of the emitter extend from the second portion of the emitter into the base. Specifically, the second portion has a bottom surface contacting the base, and the first portions comprise at least two separate impurity regions extending from the bottom surface of the second portion into the base.

20 Claims, 7 Drawing Sheets

(56) References Cited

U.S. PATENT DOCUMENTS

2004/0166625 A1    8/2004  Lee
2013/0301680 A1*  11/2013  Qiu ........................ G01K 7/01
                                                      374/184
2019/0207017 A1*   7/2019  Sadovnikov ...... H01L 29/42304

* cited by examiner

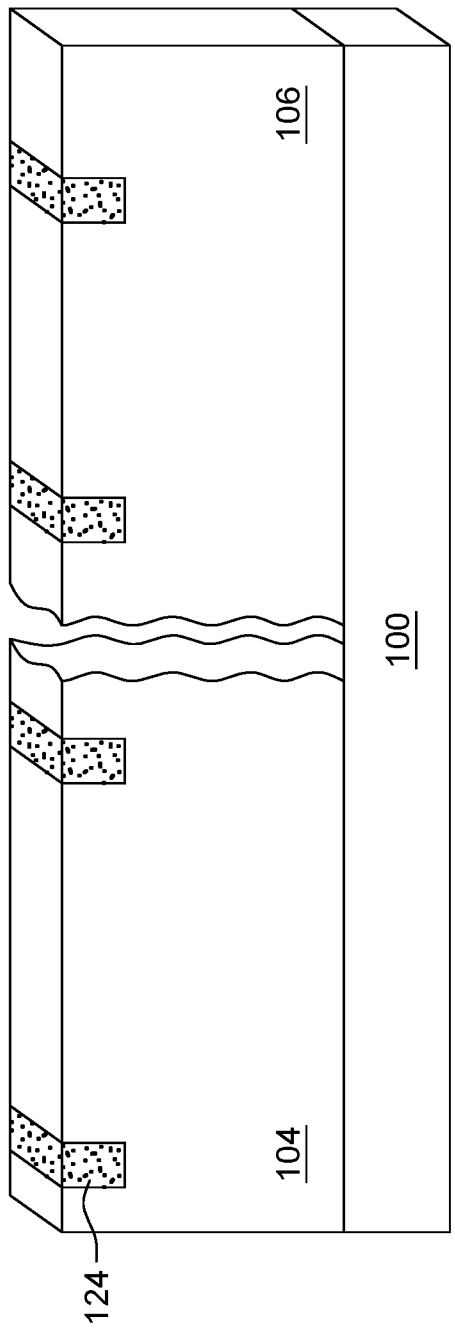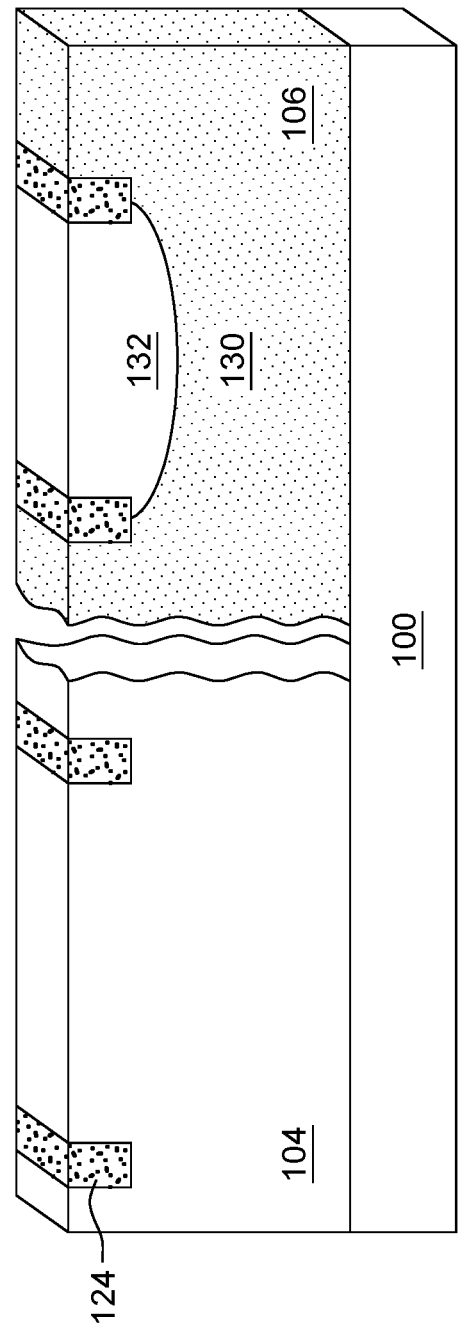

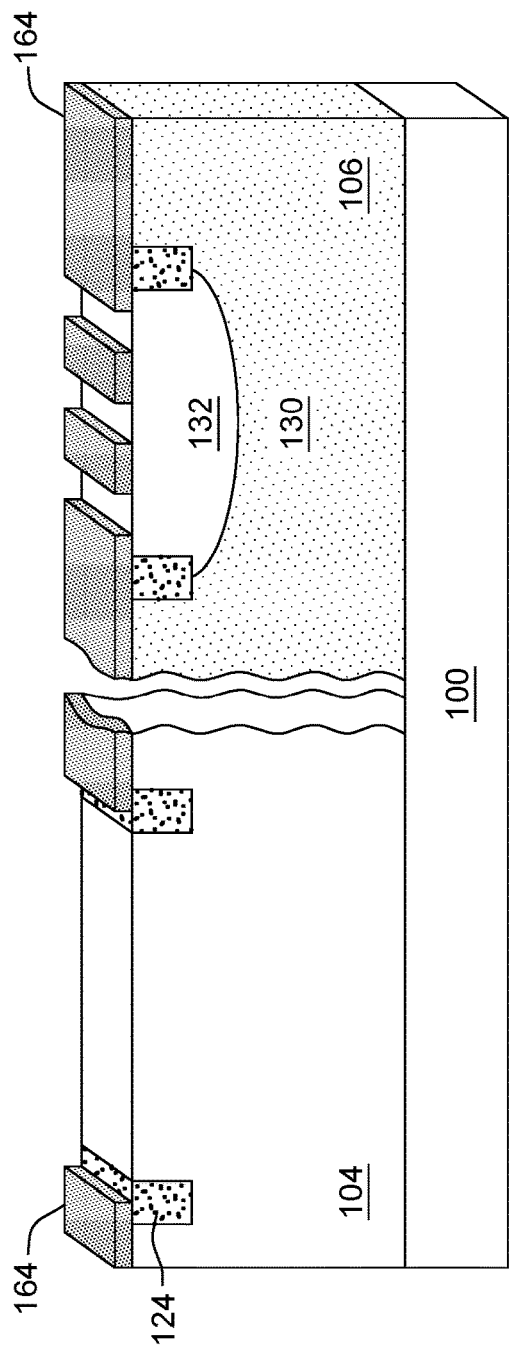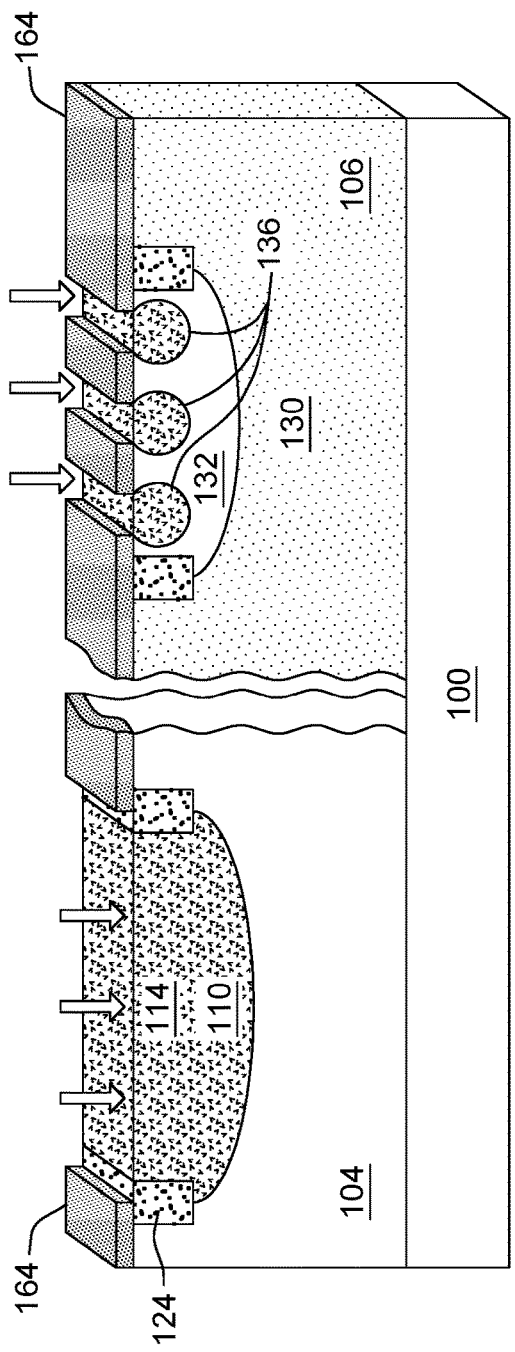

CONCURRENT MANUFACTURE OF FIELD EFFECT TRANSISTORS AND BIPOLAR JUNCTION TRANSISTORS WITH GAIN TUNING

BACKGROUND

Field of the Invention

The present disclosure relates to integrated circuits that include bipolar junction transistors and more specifically to concurrent manufacture of field effect transistors alongside bipolar junction transistors.

Description of Related Art

Manufacturing gains occur when different types of devices can be concurrently produced. One example of this occurs in integrated circuit manufacturing where it is more efficient to concurrently create peripheral, passive, parasitic devices (such as electrostatic discharge (ESD) devices) while creating the active logic switching devices that utilize field effect transistors (FETs).

Active devices often utilize unipolar transistors, such as field-effect transistors, that only use one kind of charge carrier. Bipolar junction transistors (BJTs) on the other hand use two junctions between two semiconductor types, N-type and P-type. Bipolar junction transistors are available in two types, or polarities, known as PNP and NPN based on the doping types of the three main terminal regions (collector, base, and emitter). An NPN transistor comprises two semiconductor junctions that share a thin P-doped region, and a PNP transistor comprises two semiconductor junctions that share a thin N-doped region.

Bipolar junction transistors can produce gain, where the base-emitter voltage is assumed to be approximately constant and the collector current has a beta ($\beta$) gain of a multiple of the base current. Therefore, a small current leaving the base may be amplified in the collector output. Also, a PNP transistor is "on" when its base is pulled low relative to the emitter. In a PNP transistor, the emitter-base region is forward biased, so holes are injected into the base as minority carriers. The base is very thin, and most of the holes cross the reverse-biased base-collector junction to the collector.

In standard complementary metal oxide semiconductor (CMOS) technology, a vertical bipolar junction transistor is offered as a least valuable, less important parasitic device; and, therefore, the additional expense associated with an exclusive mask cannot be afforded for performance improvement of such bipolar junction transistors. In existing processes, all the pre-existing implants are optimized for the performance targeting of the active device (e.g., metal oxide semiconductor field effect transistor (MOSFET)) and there is no budget room for bipolar junction transistor performance tuning. This situation usually results in poor bipolar junction transistor performance that is not addressed because such tuning would increase the number of processing steps and masks, and thereby increase overall production costs.

For example, it may be desirable for the parasitic device bipolar junction transistor to have a higher beta (higher gain) which would require specialized implants for the bipolar junction transistors. However, because all existing implants have been optimized for active devices, producing different implants for bipolar junction transistor would require extra masks and extra processing stops, which would increase the cost of production. In view of this, tuning that would increase the performance of parasitic devices is often not performed.

SUMMARY

Integrated circuit structures herein include a layer, and field effect transistors in a first area of the layer. The field effect transistors have source/drain regions, a channel region between the source/drain regions, a gate conductor adjacent the channel region, a well region (the channel region is part of the well region). These structures also include bipolar junction transistors in a second area of the layer. The bipolar junction transistors have a collector, a base on the collector, and an emitter on the base. The base is between the collector and the emitter.

In the field effect transistors, the source/drain regions have a source/drain impurity doping material and the well region has a well impurity doping material. The well impurity doping material and the source/drain impurity doping material are the same polarity impurity but in different concentrations.

The emitters of the bipolar transistors are formed from the same source/drain impurity doping material and the same well impurity doping material in first and second portions. The first portions of the emitters are formed of the well impurity doping material and the second portions are formed of the source/drain impurity doping material. The first portions are between the second portion and the base in each of the bipolar junction transistors.

Therefore, the bipolar junction transistor includes a collector in the layer, a base on the collector, and an emitter on the base. The base is between the collector and the emitter. The emitter comprises first portions and a second portion on the base. The first portions of the emitter are between the second portion of the emitter and the base. The first portions and the second portion comprise doped areas that are doped with the same polarity impurity, but in different concentrations. The base comprises a doped area that is doped with an opposite polarity impurity from the first portions and the second portion of the emitter.

The first portions extend from the second portion into the base. Specifically, the second portion has a bottom surface contacting the base, and the first portions comprise at least two separate impurity regions extending from the bottom surface of the second portion into the base.

Additionally, other bipolar junction transistors are adjacent the bipolar junction transistor in the integrated circuit structure. Emitters of the other bipolar junction transistors comprise differently sized and/or spaced, and/or number of first portions relative to a size, spacing, and/or number of the first portions of the emitter; however, the emitters of the other bipolar junction transistors comprise identical second portions. Thus, with these structures, emitters of different bipolar junction transistors have differently sized first portions, but the emitters of different bipolar junction transistors have the same sized second portion.

In other words, the emitters of the bipolar junction transistors each have only a single second portion but have multiple first portions. With this, the size and spacing of the first portions is uniform within each of the bipolar junction transistors; however, the size and/or spacing of the first portions is different in different bipolar junction transistors. Similarly, the number of first portions can be different in different bipolar junction transistors.

Methods herein concurrently form field effect transistors and bipolar junction transistors on the same layer. These methods concurrently form the field effect transistors in a first area of the layer and form bipolar junction transistors in a second area of the layer.

These methods form bipolar junction transistors by forming collectors in a layer and forming bases on the collectors in the layer. After this, first portions of the emitters of the bipolar junction transistors are simultaneously formed with one of the well regions of the field effect transistors using the same well impurity doping material.

In greater detail, the emitters are simultaneously formed with the well regions by applying the well impurity doping material through a single well mask to simultaneously form the well regions in the first area of the layer and the first portions on the bases in the second area of the layer. This single well mask has openings to form a single well region in each of the field effect transistors and multiple first portions in each of the bipolar junction transistors. This single well mask can also include different sized and/or spaced openings, and/or a different number of openings in locations of different bipolar junction transistors.

These methods then perform processes to form various elements of the field effect transistors by patterning shallow trench isolation regions, and gate insulators and gate conductors adjacent the channel region.

Source/drain regions of the field effect transistors are formed on opposite sides of the channel region using a source/drain impurity doping material and that same source/drain impurity doping material is simultaneously used to form a second portion of the emitter. The emitters of different bipolar junction transistors are formed to have differently sized first portions, but all the emitters of different bipolar junction transistors are formed to have the same sized second portions.

More specifically, second portions of the emitters are simultaneously formed with the source/drain regions by applying the source/drain impurity doping material through a single source/drain mask to simultaneously form the source/drain regions in the first area of the layer and the second portion of the emitters on the first portions of the emitters in the second area of the layer. The single source/drain mask has openings to form a single pair of the source/drain regions in each of the field effect transistors and a single portion of the source/drain impurity doping material in each of the bipolar junction transistors.

BRIEF DESCRIPTION OF THE DRAWINGS

The embodiments herein will be better understood from the following detailed description with reference to the drawings, which are not necessarily drawn to scale and in which:

FIGS. 1-8 are cross-sectional schematic diagrams illustrating various processing stages of manufacture of devices herein;

DETAILED DESCRIPTION

As mentioned above, in existing processes all the pre-existing implants are optimized for active device performance targeting, and there is no room for parasitic device performance tuning. This situation usually results in poor parasitic device (bipolar junction transistor) performance that is not addressed because such tuning would increase the number of processing steps and masks, and thereby increase overall production costs.

The systems and methods herein address these issues by forming the emitter of the bipolar junction transistors in two stages, where multiple first portions of each emitter are formed simultaneously with one of the well implants of active field effect transistors, and where a second portion of the emitter is formed simultaneously with the source/drain implant of the field effect transistors. The utilization of different sized and/or spaced first portions (and/or different numbers of first portions) of the emitter along with the different dopant concentrations of the first and second portions of the emitters allows each individual bipolar junction transistor to be independently tuned for ultimate parasitic device tuning, without using additional masks or processing steps.

In greater detail, the dimensions, locations, and numbers of the well mask openings for the well implant are adjusted when forming the first portions of the emitters. This causes the dopant concentrations in the first portions of the emitters to be tuned for each different bipolar junction transistor, permitting any beta value to be achieved without additional masks or processing steps. This allows the designer to produce circuits with bipolar junction transistors that have multiple different betas in the same chip, which is very useful when designing ESD protection circuits using bipolar junction transistors, either three-terminals or four terminals (SCR). This is also highly useful for PNPs used in band-gap circuits with different bipolar junction transistor betas for devices attached to input/output (I/O) pads for the purpose of controlling snap-back during ESD events.

Figure 6:
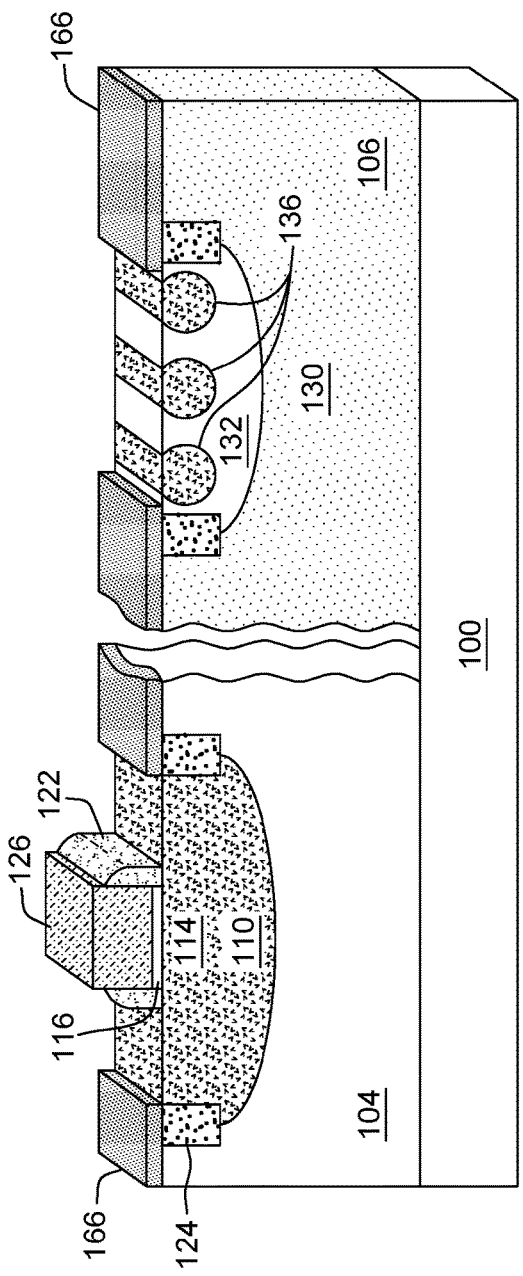
Figure 7:
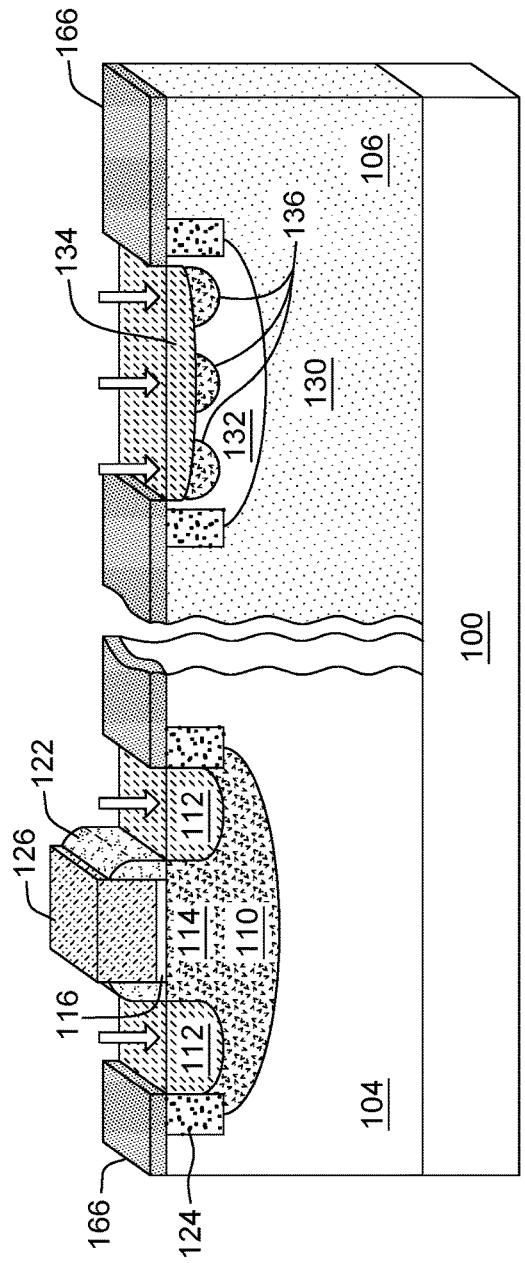
Figure 8:
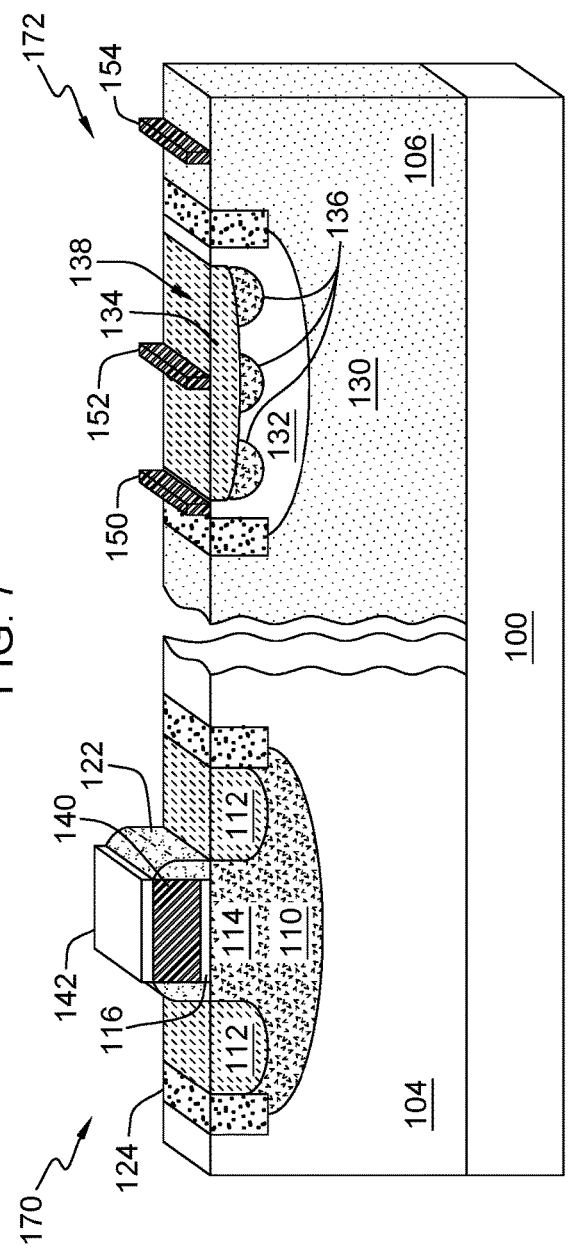

Referring now to the drawings, FIGS. 1-8 are cross-sectional views illustrating a field effect transistor being formed in an active area 104 of a layer and a bipolar junction transistor being formed in a parasitic or passive area 106 of the same layer. For example, FIG. 8 illustrates a completed field effect transistor 170 and a completed bipolar junction transistor 172. As noted previously, the processing herein concurrently forms such field effect transistors 170 and bipolar junction transistors 172 on the same layer 104, 106.

Beginning in FIG. 1, these methods begin with a substrate 100 (such as a bulk wafer) and an insulator or semiconductor layer 104, 106 formed on the substrate 100. The spacing between the first area 104 and second area 106 of the layer is not necessary, in that active devices can be formed directly next to passive devices; however, in this example the spacing illustrates that the active and passive devices can be physically separated by some distance, yet all are formed concurrently on or above the same substrate 100. Additionally, while a specific type of substrate structure is illustrated, those ordinarily skilled in the art would understand that the underlying structure utilized will depend upon the type of device is being manufactured.

As shown in FIG. 2, these processes begin forming such bipolar junction transistors 172 by forming collectors 130 in the second area 106 of the layer and forming bases 132 on the collectors 130 in the second area 106 of the layer (e.g., through dopant implants, lithographic processes, etc.). For example, a blanket boron implant can be used to form the collector 130, and the base 132 can be formed in the second area 106 of the layer simultaneously while making a first well implant (e.g., n-well, p-well, etc.) in the first area 104 of the layer. Any existing doping process can be used to simultaneously form the layers of the emitter alongside other devices, so long as the polarity (N- or P-type) of the base is opposite that of the collector and emitter.

FIG. 3 illustrates that a first mask 164 is formed (and this mask 164 is sometimes referred to herein as a "well" mask for convenience). This well mask 164 has different sized and spaced openings in the first area 104 and second area 106. More specifically, the openings in the second area 106 are smaller and more closely spaced when compared to the openings in the first area 104. Further, the pattern of openings in the well mask 164 in the second area 106 can potentially be different for each different bipolar junction transistor that is formed. In contrast, each well formed in the first area 104 will generally be the same size. This allows each different bipolar junction transistor to be independently tuned relative to all other bipolar junction transistors by forming different sizes, spacing, or numbers per transistor of the first portions 136 of the emitters through the well mask 164 in the second area 106 (as shown in FIG. 4).

Thus, as shown in FIG. 4, multiple lower or "first" portions 136 of the emitters 138 of the bipolar junction transistors 172 (see FIG. 8) are simultaneously formed with a second well region 110 being formed in the field effect transistors 170. In FIG. 4 the well impurity implant is shown using block arrows. The second well region implant used to form the first portions 136 of the emitter in FIG. 4 has an opposite doping polarity to the first well region implant used to form the base 132 of the emitter in FIG. 2. Note that when simultaneously forming the well region 110 and the first portions 136 of the emitter, such processing uses the same well impurity doping material (arrows, FIG. 4) and mask 164 in a single implant process.

Therefore, FIG. 4 illustrates that the first portions 136 of the emitters are simultaneously formed with the well regions 110 (e.g., channel regions 114) by applying the well impurity doping material through a single well mask 164 to simultaneously form the well regions 110 in the first area 104 of the layer and form the first portions 136 of the emitters on the bases 132 in the second area 106 of the layer. The single well mask 164 has openings to form a single well region 110 in each of the field effect transistors 170 and form multiple first portions 136 in each of the bipolar junction transistors 172. This single well mask 164 can include different sized and/or spaced openings, and/or a different number of openings in locations of different bipolar junction transistors 172.

Figure 5:
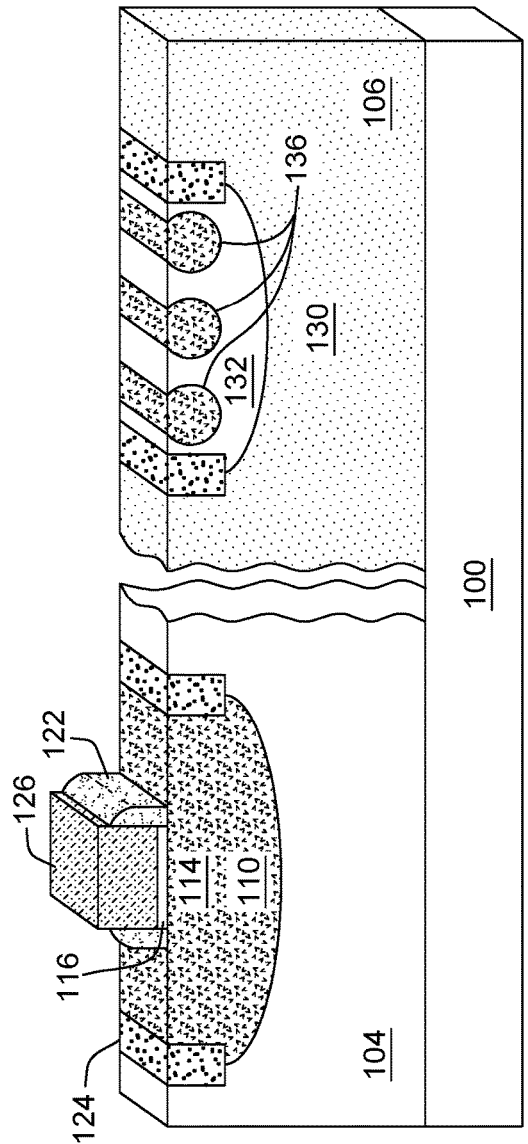

As shown in FIG. 5, these methods then perform processes to form various elements of the field effect transistors 170 by patterning shallow trench isolation regions 124, gate insulators 116 and dummy gates 126 adjacent the channel region 114, sidewall spacers 122 on the dummy gates 126, etc. Note that the field effect transistors can include more structures or less structures than shown, and that such structures can be formed at other processing stages than the one illustrated in this example. Indeed, the order in which such field effect transistor components are formed may be different than what is shown, but here FIG. 5 is provided to just generically show many transistor elements being formed at one processing stage for convenience of illustration and discussion.

FIG. 6 illustrates that a second mask 166 is formed (and this mask 166 is sometimes referred to herein as a "source/drain" mask for convenience). This source/drain mask 166 has different sized and spaced openings in the first area 104 and second area 106. More specifically, the openings in the second area 106 are smaller and more closely spaced when compared to the openings in the first area 104. Further, the pattern of openings in the source/drain mask 166 is the same for all bipolar junction transistor that are formed. This causes the second portion of the emitter to be the same for all bipolar junction transistors.

The block arrows in FIG. 7 illustrate a doping impurity implant that is sometimes referred to herein as the source/drain implant made using source/drain impurity doping material. This forms source/drain regions 112 of the field effect transistors on opposite sides of the channel region 114, and that same source/drain impurity doping material (block arrows in FIG. 7) is simultaneously used to form the second portion 134 of each of the emitters. The source/drain impurity shown in FIG. 7 has the same polarity as the well implant shown in FIG. 4; however, the two implants may comprise the exact same material, different materials, or different strengths of the same or different material, etc. As noted above, while the emitters of different bipolar junction transistors 172 are formed to potentially have differently sized first portions 136, all the emitters 138 of different bipolar junction transistors 172 are formed to have the same sized second portions 134; and the individual number, size, spacing, etc., of the first portions 136 individually tunes each bipolar junction transistor to have an individual gain value.

Therefore, FIG. 7 shows that the second portions 134 of the emitters are simultaneously formed with the source/drain regions 112 by applying the source/drain impurity doping material through the single source/drain mask 166 to simultaneously form the source/drain regions 112 in the first area 104 of the layer and the second portion 134 of the emitters on the first portions 136 of the emitters 138 in the second area 106 of the layer. The single source/drain mask 166 has openings to form a single pair of the source/drain regions 112 in each of the field effect transistors 170 and a single opening per bipolar junction transistor to form one second portion 134 per emitter using the source/drain impurity doping material.

FIG. 8 illustrates some processes that complete the devices. For example, the dummy gates 126 are removed and replaced with gate conductors 140 while various contacts 150, 152, 154 are formed and the remaining portions of the gate stack (e.g., cap, silicide, 142 etc.) are also formed.

Therefore, FIG. 8 illustrates that integrated circuit structures herein include a layer 104, 106, and field effect transistors 170 in a first area 104 of the layer (which can be referred to as a substrate). The field effect transistors 170 have source/drain regions 112, a channel region 114 between the source/drain regions 112, a gate conductor 140 adjacent the channel region 114, a well region 110 of which the channel region 114 is a part. These structures also include bipolar junction transistors 172 in a second area 106 of the layer. The bipolar junction transistors 172 have a collector 130, a base 132 on the collector 130, and an emitter 138 on the base 132. The base 132 is between the collector 130 and the emitter 138.

In the field effect transistors 170, the source/drain regions 112 have a source/drain impurity doping material and the well region 110 has a well impurity doping material. The well impurity doping material and the source/drain impurity doping material are the same polarity impurity but in different concentrations.

The emitters 138 of the bipolar transistors are formed from the same source/drain impurity doping material and the same well impurity doping material. The first portions 136 of the emitters 138 are formed of the well impurity doping material and the second portions 134 are formed of the source/drain impurity doping material. The first portions 136 of the emitter are between the second portion 134 of the emitter and the base 132 in each of the bipolar junction transistors 172.

Therefore, the bipolar junction transistor 172 includes a collector 130 in the layer 104, 106, a base 132 on the collector 130, and an emitter 138 on the base 132. The base 132 is between the collector 130 and the emitter 138. The emitter 138 comprises first portions 136 and a second portion 134 on the base 132. The first portions 136 are between the second portion 134 and the base 132. The first portions 136 and the second portion 134 comprise doped areas of the layer 106 doped with a same polarity impurity in different concentrations. The base 132 comprises a doped area of the layer 106 that is doped with an opposite polarity impurity from the first portions 136 and the second portion 134 of the emitter 138.

The first portions 136 extend from the second portion 134 into the base 132. Specifically, the second portion 134 has a straight or rounded arbitrarily named "bottom" surface contacting the base 132, and the first portions 136 comprise at least two separate impurity regions (which can be rectangular, curved, etc.) extending somewhat perpendicular from the bottom surface of the second portion 134 into the base 132. Therefore, the base 132 contacts the first portions 136 and the areas of the bottom second portion 134 not covered by the first portions 136.

Figure 9:
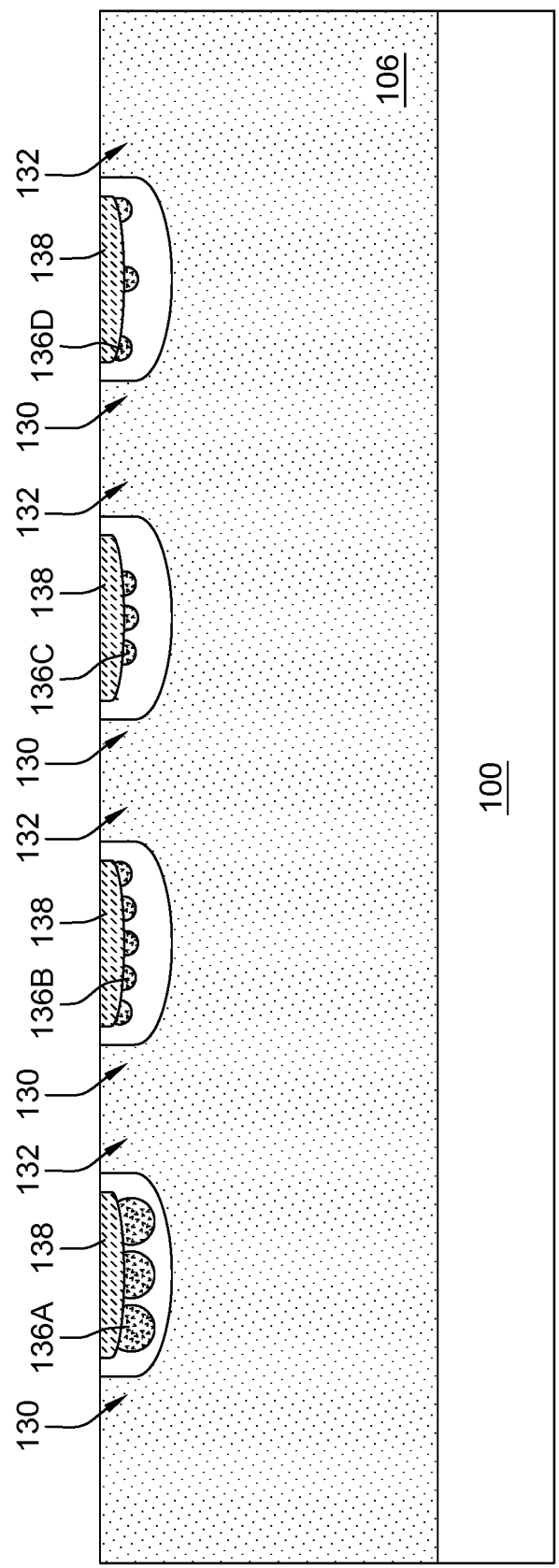
FIG. 9 is a cross-sectional schematic diagram illustrating different bipolar junction transistors produced herein.
Figure 10:
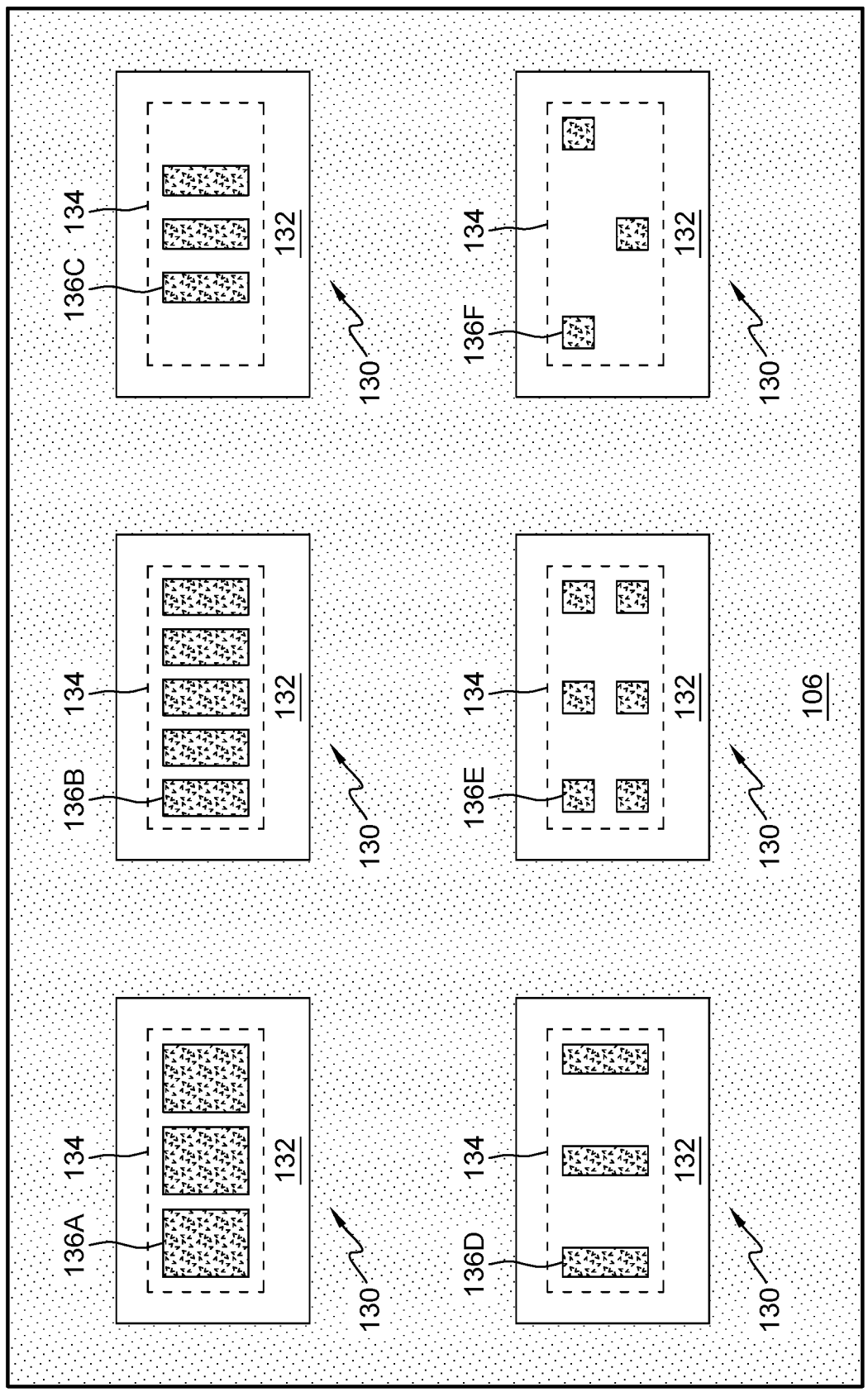
FIG. 10 is a top (plan) view schematic diagram illustrating different bipolar junction transistors produced herein.

Additionally, as shown in cross-sectional view in FIG. 9, and top view in FIG. 10, other bipolar junction transistors are adjacent one another in the integrated circuit structure. Emitters 138 of the other bipolar junction transistors 172 comprise differently sized and/or spaced, and/or number of first portions 136A-136F relative to a size, spacing, and/or number of the first portion 136A of the first emitter; however, the emitters of the other bipolar junction transistors comprise identical second portions 134 relative to the second portion 134 of the first emitter. Thus, with these structures, emitters of different bipolar junction transistors have differently sized first portions 136A-F, but the emitters of different bipolar junction transistors all have the same sized second portion 134.

In the examples shown in FIGS. 9 and 10, the (upper) left-most bipolar junction transistor includes three relatively larger first portions 136A of the emitter, the next bipolar junction transistor includes five relatively smaller first portions 136B of the emitter, the next bipolar junction transistor includes three relatively smaller, more closely spaced first portions 136C of the emitter, the next bipolar junction transistor includes three relatively smaller, less closely spaced first portions 136D of the emitter, etc. FIG. 10 also illustrates, in the last two bipolar junction transistors, that the first portions 136E, 136F of the emitter or can be arranged in uniform patterns (136E) or nonuniform patterns (136F). Note that in FIG. 10, for clarity, the second portion 134 of the emitter is only shown as a dashed line to allow the first portions 136A-F to be seen, again demonstrating that the single second portion 134 of the emitter is uniform in size and shape among all bipolar junction transistors.

Therefore, FIGS. 9 and 10 show that the emitters of the bipolar junction transistors each have only a single second portion 134 but have multiple first portions 136. With this, the size and spacing of the first portions 136A-F is uniform within each of the bipolar junction transistors; however, the size and/or spacing of the first portions 136A-F is different in different bipolar junction transistors. Similarly, the number of first portions 136A-F can be different in different bipolar junction transistors. Thus, as noted above, the utilization of different sized and/or spaced first portions 136 (and/or different numbers of first portions 136) of the emitter 138 along with the different dopant concentrations of the first (136) and second (134) portions of the emitters 138 allows each individual bipolar junction transistor 172 to be independently tuned for ultimate parasitic device tuning, without using additional masks or processing steps.

Figure 11:
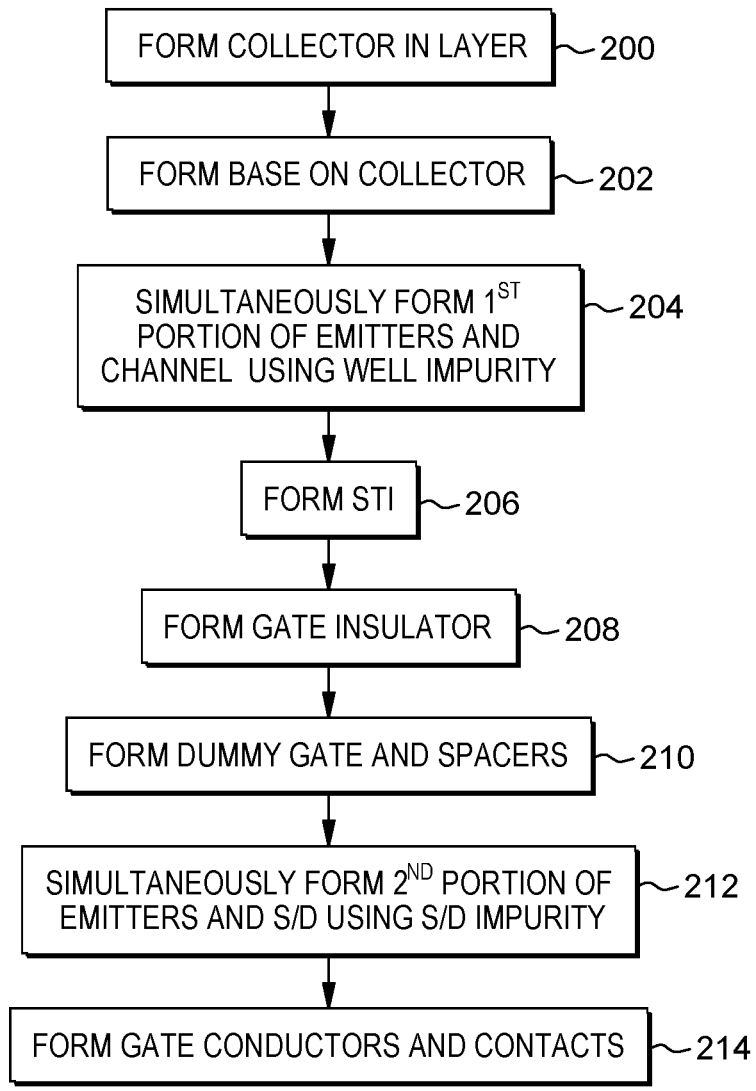
FIG. 11 is a flow diagram illustrating processing performed herein.

As shown in the flowchart in FIG. 11 processing herein concurrently forms field effect transistors and bipolar junction transistors on the same layer. These methods concurrently form the field effect transistors in a first area of the layer and form bipolar junction transistors in a second area of the layer.

Specifically, methods herein form bipolar junction transistors by forming collectors in a layer (item 200) and forming bases (item 202) on the collectors in the layer. After this, in item 204 first portions of the emitters of the bipolar junction transistors are simultaneously formed with the well regions of the field effect transistors using the same well impurity doping material.

In greater detail, a first portion of the emitters are simultaneously formed with the well regions in item 204 by applying the well impurity doping material through a single well mask to simultaneously form the well regions in the first area of the substrate and the first portions on the bases in the second area of the substrate. The single well mask has openings to form a single well region in each of the field effect transistors and multiple first portions in each of the bipolar junction transistors. This single well mask can include differently sized and/or spaced openings, and/or a different number of openings in locations of different bipolar junction transistors.

These methods then perform processes to form various elements of the field effect transistors by patterning shallow trench isolation regions (item 206), and gate insulators (item 208), dummy gates, and sidewall spacers (item 210) adjacent the channel region.

In item 212, source/drain regions of the field effect transistors are formed on opposite sides of the channel region using a source/drain impurity doping material and that same source/drain impurity doping material is simultaneously used to form a second portion of the emitter. The emitters of different bipolar junction transistors are formed to have differently sized first portions, but all the emitters of different bipolar junction transistors are formed to have the same sized second portion.

More specifically, in item 212 the second portions of the emitters are simultaneously formed with the source/drain regions by applying the source/drain impurity doping material through a single source/drain mask to simultaneously form the source/drain regions in the first area of the substrate and the second portion of the emitters on the first portions of the emitters in the second area of the substrate. The single source/drain mask has openings to form a single pair of the source/drain regions in each of the field effect transistors and a single portion of the source/drain impurity doping material in each of the bipolar junction transistors.

The dummy gates are removed and replaced with gate conductors while various contacts are formed and the remaining portions of the gate stack (e.g., silicide, etc.) are also formed, as shown in item 214. Other overlying insulator layers, contacts, vias, wiring, etc., can be formed to further complete the integrated circuit structure.

For purposes herein, a "semiconductor" is a material or structure that may include an implanted or in situ (e.g., epitaxially grown) impurity that allows the material to sometimes be a conductor and sometimes be an insulator, based on electron and hole carrier concentration. As used herein, "implantation processes" can take any appropriate form (whether now known or developed in the future) and can be, for example, ion implantation, etc. Epitaxial growth occurs in a heated (and sometimes pressurized) environment that is rich with a gas of the material that is to be grown.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed (grown or deposited) from any of the many candidate low dielectric constant materials (low-K (where K corresponds to the dielectric constant of silicon dioxide) materials such as fluorine or carbon-doped silicon dioxide, porous silicon dioxide, porous carbon-doped silicon dioxide, spin-on silicon or organic polymeric dielectrics, etc.) or high dielectric constant (high-K) materials, including but not limited to silicon nitride, silicon oxynitride, a gate dielectric stack of $SiO_2$ and $Si_3N_4$, hafnium oxide ($HfO_2$), hafnium zirconium oxide ($HfZrO_2$), zirconium dioxide ($ZrO_2$), hafnium silicon oxynitride (HfSiON), hafnium aluminum oxide compounds ($HfAlO_x$), other metal oxides like tantalum oxide, etc. The thickness of dielectrics herein may vary contingent upon the required device performance.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

There are various types of transistors, which have slight differences in how they are used in a circuit. For example, a bipolar transistor has terminals labeled base, collector, and emitter. A small current at the base terminal (that is, flowing between the base and the emitter) can control, or switch, a much larger current between the collector and emitter terminals. Another example is a field-effect transistor, which has terminals labeled gate, source, and drain. A voltage at the gate can control a current between source and drain. Within such transistors, a semiconductor (channel region) is positioned between the conductive source region and the similarly conductive drain (or conductive source/emitter regions), and when the semiconductor is in a conductive state, the semiconductor allows electrical current to flow between the source and drain, or collector and emitter. The gate is a conductive element that is electrically separated from the semiconductor by a "gate oxide" (which is an insulator); and current/voltage within the gate changes makes the channel region conductive, allowing electrical current to flow between the source and drain. Similarly, current flowing between the base and the emitter makes the semiconductor conductive, allowing current to flow between the collector and emitter.

A positive-type transistor "P-type transistor" uses impurities such as boron, aluminum or gallium, etc., within an intrinsic semiconductor substrate (to create deficiencies of valence electrons) as a semiconductor region. Similarly, an "N-type transistor" is a negative-type transistor that uses impurities such as antimony, arsenic or phosphorous, etc., within an intrinsic semiconductor substrate (to create excessive valence electrons) as a semiconductor region.

Generally, transistor structures, in one example, can be formed by depositing or implanting impurities into a substrate to form at least one semiconductor channel region, bordered by shallow trench isolation regions below the top (upper) surface of the substrate. A "substrate" herein can be any material appropriate for the given purpose (whether now known or developed in the future) and can be, for example, silicon-based wafers (bulk materials), ceramic materials, organic materials, oxide materials, nitride materials, etc., whether doped or undoped. The "shallow trench isolation" (STI) structures are generally formed by patterning openings/trenches within the substrate and growing or filling the openings with a highly insulating material (this allows different active areas of the substrate to be electrically isolated from one another).

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a negative resist (illuminated portions remain) or positive resist (illuminated portions are rinsed off). A material removal process is then performed (e.g., wet etching, anisotropic etching (orientation dependent etching), plasma etching (reactive ion etching (RIE), etc.)) to remove the unprotected portions of the material below the resist to be patterned. The resist is subsequently removed to leave the underlying material patterned according to the light exposure pattern (or a negative image thereof).

For purposes herein, "sidewall spacers" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as sidewall spacers.

While only one or a limited number of transistors are illustrated in the drawings, those ordinarily skilled in the art would understand that many different types transistor could be concurrently formed with the embodiment herein and the drawings are intended to show concurrent formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

The terminology used herein is for the purpose of describing particular embodiments only and is not intended to be limiting of the foregoing. As used herein, the singular forms "a," "an," and "the" are intended to include the plural forms as well, unless the context clearly indicates otherwise. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element.

Each respective figure, in addition to illustrating methods of and functionality of the present embodiments at various stages, also illustrates the logic of the method as implemented, in whole or in part, by one or more devices and structures. Such devices and structures are configured to (i.e., include one or more components, such as resistors, capacitors, transistors and the like that are connected to enable the performing of a process) implement the method described above. In other words, one or more computer hardware devices can be created that are configured to implement the method and processes described herein with reference to the figures and their corresponding descriptions.

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description but is not intended to be exhaustive or limited to the embodiments in the form disclosed. Many modifications and variations will be apparent to those of ordinary skill in the art without departing from the scope and spirit of the embodiments herein. The embodiments were chosen and described in order to best explain the principles of such, and the practical application, and to enable others of ordinary skill in the art to understand the various embodiments with various modifications as are suited to the particular use contemplated.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. A structure comprising:
a collector;
a base on the collector; and
an emitter on the base,
wherein the base is between the collector and the emitter,
wherein the emitter comprises a plurality of separate first portions and a second portion on the base,
wherein the second portion physically contacts the base,
wherein the first portions are between the second portion and the base, and
wherein the first portions extend from the bottom of the second portion into the base.

2. The structure according to claim 1, wherein the first portions comprise at least two separate impurity regions extending from the second portion into the base.

3. The structure according to claim 1, wherein the first portions and the second portion comprise doped areas doped with a same polarity impurity in different concentrations, and
wherein the base comprises a doped area doped with an opposite polarity impurity from the first portions and the second portion of the emitter.

4. The structure according to claim 1, further comprising other bipolar junction transistors wherein emitters of the other bipolar junction transistors comprise differently sized first portions relative to a size of the first portions of the emitter.

5. The structure according to claim 1, further comprising other bipolar junction transistors wherein emitters of the other bipolar junction transistors comprise differently spaced first portions relative to a spacing of the first portions of the emitter.

6. The structure according to claim 1, further comprising other bipolar junction transistors wherein emitters of the other bipolar junction transistors comprise a different number of first portions relative to a number of the first portions of the emitter.

7. The structure according to claim 1, further comprising other bipolar junction transistors wherein emitters of the other bipolar junction transistors comprise identical second portions relative to the second portion of the emitter.

8. An integrated circuit structure comprising:
a layer;
field effect transistors in a first area of the layer, wherein the field effect transistors comprise source/drain regions, a well region comprising a channel region, wherein the channel region is between the source/drain regions, and a gate conductor adjacent the channel region; and bipolar junction transistors in a second area of the layer, wherein the bipolar junction transistors comprise a collector, a base on the collector, and an emitter on the base, wherein the base is between the collector and the emitter, wherein the source/drain regions have a source/drain impurity doping material, wherein the well region has a well impurity doping material, wherein the emitter has the source/drain impurity doping material and the well impurity doping material, wherein emitters of different ones of the bipolar junction transistors comprise: differently sized separate first portions of the well impurity doping material; and a second portion physically contacting the base, wherein the first portions extend from the bottom of the second portion into the base, and wherein the emitters of the different ones of the bipolar junction transistors comprise a same sized second portion of the source/drain impurity doping material.

9. The integrated circuit structure according to claim 8, wherein the emitters of the bipolar junction transistors each include only a single second portion and multiple ones of the first portions.

10. The integrated circuit structure according to claim 8, wherein a size of the first portions is uniform within each of the bipolar junction transistors, and sizes of the first portions are different in different ones of the bipolar junction transistors.

11. The integrated circuit structure according to claim 8, wherein numbers of the first portions are different in different ones of the bipolar junction transistors.

12. The integrated circuit structure according to claim 8, wherein a spacing of the first portions is uniform within each of the bipolar junction transistors, and spacings of the first portions are different in different ones of the bipolar junction transistors.

13. The integrated circuit structure according to claim 8, wherein, in the bipolar junction transistors, the first portions are between the second portion and the base.

14. The integrated circuit structure according to claim 8, wherein the well impurity doping material and the source/drain impurity doping material comprise a same polarity impurity in different concentrations.

15. A method comprising:
forming field effect transistors in a first area of a layer by forming source/drain regions, well regions comprising channel regions, wherein the channel regions are between the source/drain regions, and gate conductors adjacent the channel region; and during the forming field effect transistors, concurrently forming bipolar junction transistors in a second area of the layer by forming collectors, bases on the collectors, and emitters on the bases, wherein the bases are formed between the collectors and the emitters, wherein the source/drain regions are formed using a source/drain impurity doping material, wherein the well regions are formed using a well impurity doping material, wherein the emitters are simultaneously formed with the well regions and the source/drain regions using the well impurity doping material and the source/drain impurity doping material, wherein emitters of different ones of the bipolar junction transistors comprise: differently sized separate first portions of the well impurity doping material; and a second portion physically contacting the base, wherein the first portions extend from the bottom of the second portion into the base, and wherein the emitters of the different ones of the bipolar junction transistors are formed to have a same sized second portion of the source/drain impurity doping material.

16. The method according to claim 15, wherein the emitters are simultaneously formed with the well regions in processing comprising:
simultaneously applying the well impurity doping material through a single well mask to form the well regions in the first area of the layer and the first portions on the bases in the second area of the layer, wherein the single well mask has openings to form a single one of the well regions in each of the field effect transistors and multiple ones of the first portions in each of the bipolar junction transistors.

17. The method according to claim 16, wherein the single well mask includes different sized openings in locations of different ones of the bipolar junction transistors.

18. The method according to claim 16, wherein the single well mask includes different numbers of openings in locations of different ones of the bipolar junction transistors.

19. The method according to claim 16, wherein the single well mask includes differently spaced openings in locations of different ones of the bipolar junction transistors.

20. The method according to claim 15, wherein the emitters are simultaneously formed with the source/drain regions by simultaneously applying the source/drain impurity doping material through a single source/drain mask to form the source/drain regions in the first area of the layer and the second portion of the emitters on the first portions in the second area of the layer, wherein the single source/drain mask has openings to form a single pair of the source/drain regions in each of the field effect transistors and a single second portion of the source/drain impurity doping material in each of the bipolar junction transistors.

* * * * *